United States Patent
Lipkind et al.

(10) Patent No.: US 10,438,769 B1
(45) Date of Patent: Oct. 8, 2019

(54) ARRAY-BASED CHARACTERIZATION TOOL

(71) Applicant: KLA-Tencor Corporation, Milpitas, CA (US)

(72) Inventors: Alex Lipkind, Milpitas, CA (US); Alon Rosenthal, Norwalk, CT (US); Frank Chilese, San Ramon, CA (US); John Gerling, Livermore, CA (US); Lawrence Muray, Milpitas, CA (US); Robert Haynes, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/969,555

(22) Filed: May 2, 2018

(51) Int. Cl.
*H01J 37/28* (2006.01)
*G21K 5/04* (2006.01)
*H01J 37/147* (2006.01)
*H01J 37/153* (2006.01)
*H01J 37/244* (2006.01)

(52) U.S. Cl.
CPC ........ H01J 37/1477 (2013.01); H01J 37/153 (2013.01); H01J 37/28 (2013.01); *H01J 37/244* (2013.01); *H01J 2237/063* (2013.01); *H01J 2237/151* (2013.01); *H01J 2237/1534* (2013.01); *H01J 2237/2448* (2013.01)

(58) Field of Classification Search
CPC ...... H01J 37/1477; H01J 37/153; H01J 37/28; H01J 37/244; H01J 2237/063; H01J 2237/151; H01J 2237/1534; H01J 2237/2448
USPC ............. 250/306, 307, 309, 310, 311, 492.1, 250/492.2, 492.21, 492.22, 492.23, 492.3
See application file for complete search history.

(56) References Cited

U.S. PATENT DOCUMENTS 6,633,034 B1 * 10/2003 Crewe .................. H01J 37/244
250/281
9,431,209 B2 8/2016 Ren et al.
(Continued)

FOREIGN PATENT DOCUMENTS

WO 2004008255 1/2004

OTHER PUBLICATIONS

International Search Report and Written Opinion dated Aug. 16, 2019 for PCT/US2019/029764.

*Primary Examiner* — Nicole M Ippolito
(74) *Attorney, Agent, or Firm* — Suiter Swantz pc llo

(57) ABSTRACT

A scanning electron microscopy (SEM) system includes a plurality of electron beam sources configured to generate a primary electron beam. The SEM system includes an electron-optical column array with a plurality of electron-optical columns. An electron-optical column includes a plurality of electron-optical elements. The plurality of electron-optical elements includes a deflector layer configured to be driven via a common controller shared by at least some of the plurality of electron-optical columns and includes a trim deflector layer configured to be driven by an individual controller. The plurality of electron-optical elements is arranged to form an electron beam channel configured to direct the primary electron beam to a sample secured on a stage, which emits an electron beam in response to the primary electron beam. The electron-optical column includes an electron detector. The electron beam channel is configured to direct the electron beam to the electron detector.

47 Claims, 4 Drawing Sheets

(56) References Cited

U.S. PATENT DOCUMENTS

| | | |
|---|---|---|
| 2002/0117967 A1 | 8/2002 | Gerlach et al. |
| 2002/0125428 A1 | 9/2002 | Krans |
| 2003/0001095 A1 | 1/2003 | Lo et al. |
| 2008/0237465 A1* | 10/2008 | Hatano ................ G01N 23/225 250/311 |
| 2010/0148087 A1* | 6/2010 | Doering ................ B82Y 10/00 250/396 R |
| 2010/0237240 A1* | 9/2010 | Watson ................ H01J 49/482 250/305 |
| 2013/0284925 A1* | 10/2013 | Tanigaki ................ H01J 37/22 250/311 |

* cited by examiner

ARRAY-BASED CHARACTERIZATION TOOL

TECHNICAL FIELD

The present invention generally relates to wafer and photomask/reticle characterization and fabrication and, more particularly, to an array-based characterization tool.

BACKGROUND

The fabrication of semiconductor devices, such as logic and memory devices, typically includes processing a semiconductor device using a large number of semiconductor fabrication and metrology processes to form various features and multiple layers of the semiconductor devices. Select fabrication processes utilize photomasks/reticles to print features on a semiconductor device such as a wafer. As semiconductor devices become smaller and smaller laterally and extended vertically, it becomes critical to develop enhanced inspection and review devices and procedures to increase sensitivity and throughput of photomask/reticle, and wafer inspection processes.

One characterization technology includes electron beam-based characterization such as scanning electron microscopy (SEM). In some instances of SEMs, scanning electron microscopy is performed via secondary electron beam collection (e.g., a secondary electron (SE) imaging system). In some instances of SEMs, scanning electron microscopy is performed by splitting a single electron beam into numerous beams and utilizing a single electron-optical column to individually tune and scan the numerous beams (e.g., a multi-beam SEM system). In some instances of SEMs, scanning electron microscopy is performed via an SEM system which includes an increased number of electron-optical columns (e.g., a multi-column SEM system).

SEM systems may image a sample through the collection and analysis of electron beams including electrons emitted and/or backscattered from the sample as primary electron beams are scanned across the sample. The electron beams are directed (e.g., focused or steered) to the sample and then back to the detectors within electron-optical columns of the SEM systems via a set of deflectors. The utilization of the set of deflectors may result in deflection aberrations within the collected and analyzed electron beams. The deflection aberrations may be caused by non-uniformities in the deflection field.

Therefore, it would be advantageous to provide a system and method that cures the shortcomings described above.

SUMMARY

A scanning electron microscopy (SEM) system is disclosed, in accordance with one or more embodiments of the present disclosure. In one embodiment, the SEM system includes a plurality of electron beam sources. In another embodiment, at least some of the electron beam sources are configured to generate a primary electron beam. In another embodiment, the SEM system includes an electron-optical column array with a plurality of electron-optical columns. In another embodiment, an electron-optical column of the plurality of electron-optical columns includes a plurality of electron-optical elements. In another embodiment, the plurality of electron-optical elements includes a deflector layer. In another embodiment, the deflector layer includes an upper deflector configured to receive a first voltage and a lower deflector configured to receive an additional voltage. In another embodiment, the deflector layer is configured to be driven via a common controller shared by at least some of the plurality of electron-optical columns. In another embodiment, the plurality of electron-optical elements includes a trim deflector layer. In another embodiment, the trim deflector layer includes an upper trim deflector configured to receive a first trim voltage and a lower trim deflector configured to receive an additional trim voltage. In another embodiment, the trim deflector layer is configured to be driven by an individual controller. In another embodiment, the plurality of electron-optical elements is arranged to form an electron beam channel. In another embodiment, the electron beam channel is configured to direct the primary electron beam to a sample secured on a stage. In another embodiment, the sample emits an electron beam in response to the primary electron beam. In another embodiment, the electron-optical column includes at least one electron detector. In another embodiment, the electron beam channel is configured to direct the electron beam to the at least one electron detector.

An electron-optical system is disclosed, in accordance with one or more embodiments of the present disclosure. In one embodiment, the electron-optical system includes an electron-optical column array. In another embodiment, the electron-optical column array includes a plurality of electron-optical columns. In another embodiment, an electron-optical column of the plurality of electron-optical columns includes a plurality of electron-optical elements. In another embodiment, the plurality of electron-optical elements includes a deflector layer. In another embodiment, the deflector layer includes an upper deflector configured to receive a first voltage and a lower deflector configured to receive an additional voltage. In another embodiment, the deflector layer is configured to be driven via a common controller shared by at least some of the plurality of electron-optical columns. In another embodiment, the plurality of electron-optical elements includes a trim deflector layer. In another embodiment, the trim deflector layer includes an upper trim deflector configured to receive a first trim voltage and a lower trim deflector configured to receive an additional trim voltage. In another embodiment, the trim deflector layer is configured to be driven by an individual controller. In another embodiment, the plurality of electron-optical elements is arranged to form an electron beam channel. In another embodiment, the electron beam channel is configured to direct the primary electron beam to a sample secured on a stage. In another embodiment, the sample emits an electron beam in response to the primary electron beam. In another embodiment, the electron-optical column includes at least one electron detector. In another embodiment, the electron beam channel is configured to direct the electron beam to the at least one electron detector.

A scanning electron microscopy (SEM) system is disclosed, in accordance with one or more embodiments of the present disclosure. In one embodiment, the SEM system includes a plurality of electron beam sources. In another embodiment, at least some of the electron beam sources are configured to generate a primary electron beam. In another embodiment, the SEM system includes an electron-optical column array with a plurality of electron-optical columns. In another embodiment, at least some of the electron-optical columns include a plurality of electron-optical elements. In another embodiment, the plurality of electron-optical elements is arranged to form a conical electron beam channel. In another embodiment, the conical electron beam channel is configured to direct the primary electron beam to a sample secured on a stage. In another embodiment, the sample emits an electron beam in response to the primary electron beam.

In another embodiment, the at least some of the electron-optical columns include at least one electron detector. In another embodiment, the conical electron beam channel is configured to direct the electron beam to the at least one electron detector.

An electron-optical system is disclosed, in accordance with one or more embodiments of the present disclosure. In one embodiment, the electron-optical system includes an electron-optical column array. In another embodiment, the electron-optical column array includes a plurality of electron-optical columns. In another embodiment, an electron-optical column of the plurality of electron-optical columns includes a plurality of electron-optical elements. In another embodiment, the plurality of electron-optical elements is arranged to form a conical electron beam channel. In another embodiment, the conical electron beam channel is configured to direct the primary electron beam to a sample secured on a stage. In another embodiment, the sample emits an electron beam in response to the primary electron beam. In another embodiment, the electron-optical column includes at least one electron detector. In another embodiment, the conical electron beam channel is configured to direct the electron beam to the at least one electron detector.

A characterization system is disclosed, in accordance with one or more embodiments of the present disclosure. In one embodiment, the characterization system includes a plurality of radiation sources. In another embodiment, at least some of the radiation sources are configured to generate a primary beam of radiation. In another embodiment, the characterization system includes a column array. In another embodiment, the column array includes a plurality of columns. In another embodiment, a column of the plurality of columns includes a plurality of elements. In another embodiment, the plurality of elements includes a deflector layer configured to receive a voltage. In another embodiment, the deflector layer is configured to be driven via a common controller shared by at least some of the plurality of columns. In another embodiment, the plurality of elements includes a trim deflector layer configured to receive a trim voltage. In another embodiment, the trim deflector layer is configured to be driven by an individual controller. In another embodiment, the plurality of elements is arranged to form a beam channel. In another embodiment, the beam channel is configured to direct the primary beam of radiation to a sample secured on a stage. In another embodiment, the sample generates a beam of radiation in response to the primary beam of radiation. In another embodiment, the column includes at least one detector. In another embodiment, the beam channel is configured to direct the beam of radiation generated by the sample to the at least one detector.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1:
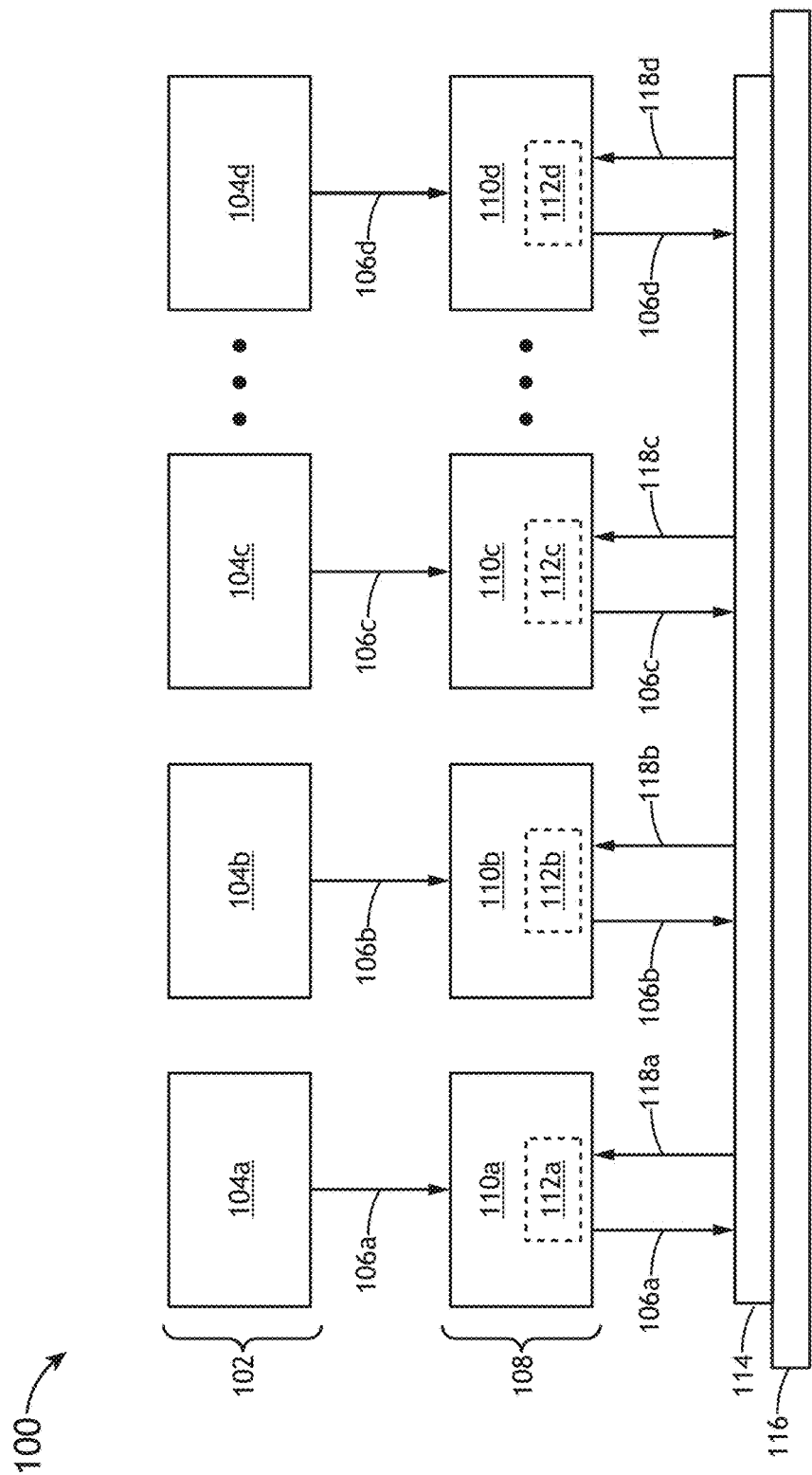
FIG. 1 illustrates a simplified block diagram of a scanning electron microscopy (SEM) characterization tool, in accordance with one or more embodiments of the present disclosure.

Reference will now be made in detail to the subject matter disclosed, which is illustrated in the accompanying drawings.

Referring generally to FIGS. 1-4, an array-based characterization tool is disclosed, in accordance with one or more embodiments of the present disclosure.

Embodiments of the present disclosure are directed to providing an SEM characterization tool that applies a common mode voltage (e.g., common to electron-optical columns within an electron-optical column array) to a set of deflectors in the electron-optical columns within the electron-optical column array. It is noted herein a characterization tool of the present disclosure may be configured as any imaging-based characterization tool known in the art including, but not limited to, an inspection tool, a review tool, an imaging-based overlay metrology tool, or the like.

Embodiments of the present disclosure are also directed to providing an SEM characterization tool that applies a voltage to an additional set of deflectors within each electron-optical column in the electron-optical column array substantially simultaneously with the applying of the common mode voltage to the set of deflectors, the additional voltage being dynamic and unique to each electron-optical column. It is noted herein that creating voltage drivers capable of the common mode voltage while simultaneously providing a highly accurate and dynamic voltage unique to each electron-optical column is believed to be not optimal, not practical, and difficult with SEM characterization tools known in the art.

Embodiments of the present disclosure are also directed to reducing the number, complexity, volume occupied, and power consumption of electron components within an SEM characterization tool. Embodiments of the present disclosure are also directed to improving secondary electron capture rate in the SEM characterization tool. Embodiments of the present disclosure are also directed to reducing deflection aberrations and promoting deflection field uniformity of deflectors within the SEM characterization tool.

Embodiments of the present disclosure are directed to providing a characterization tool that applies a common mode static and/or dynamic voltage (e.g., common to columns within a column array) to a set of deflectors in the columns within the column array. Embodiments of the present disclosure are also directed to providing a characterization tool that applies a voltage to an additional set of deflectors within each column in the column array substantially simultaneously with the applying of the common mode voltage to the set of deflectors, the additional voltage being static and/or dynamic and unique to each column. Embodiments of the present disclosure are also directed to reducing the number, complexity, volume occupied, and power consumption of components within a characterization tool. Embodiments of the present disclosure are also directed to improving capture rate in the characterization tool. Embodiments of the present disclosure are also directed to reducing deflection aberrations and promoting deflection field uniformity of deflectors within the characterization tool.

Figure 2:
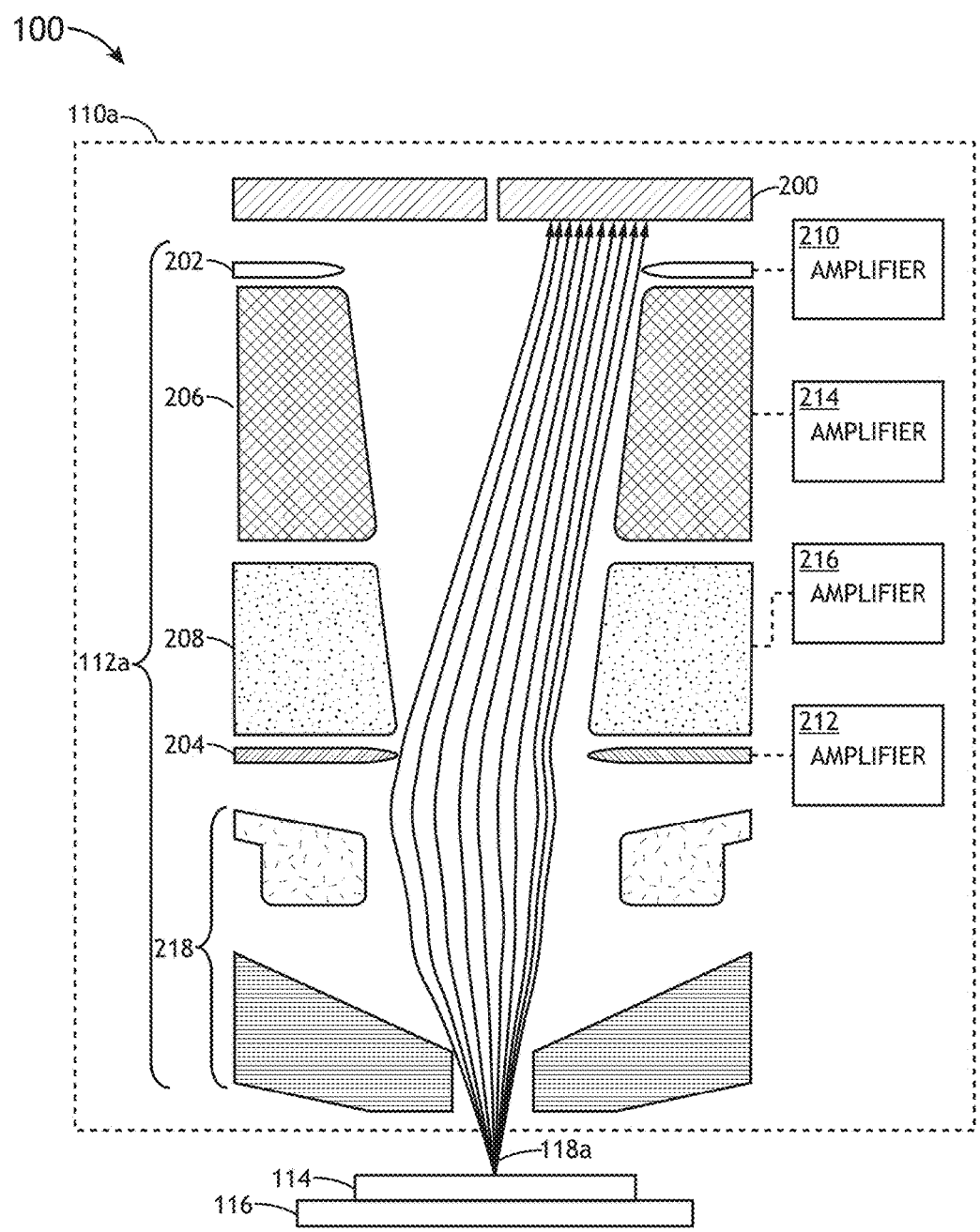
FIG. 2 illustrates a simplified schematic view of an electron-optical column of an SEM characterization tool, in accordance with one or more embodiments of the present disclosure.

FIGS. 1 and 2 generally illustrate a scanning electron microscopy (SEM) characterization tool 100, in accordance with one or more embodiments of the present disclosure.

FIG. 1 illustrates a simplified schematic view of the SEM characterization tool 100, in accordance with one or more embodiments of the present disclosure. In one embodiment, the SEM characterization tool 100 includes an electron beam source array 102. In another embodiment, the electron beam source array 102 includes one or more electron beam sources. For example, the electron beam source array 102 may include, but is not limited to, a first electron beam source 104a, a second electron beam source 104b, a third electron beam source 104c, and/or at least a fourth electron beam source 104d. In another embodiment, the one or more electron beam sources include an electron beam emitter, or electron gun.

In another embodiment, the SEM characterization tool 100 includes an electron-optical column array 108. In another embodiment, the electron-optical column array 108 includes one or more electron-optical columns. For example, the electron-optical column array 108 may include, but is not limited to, a first electron-optical column 110a, a second electron-optical column 110b, a third electron-optical column 110c, and/or at least a fourth electron-optical column 110d.

In another embodiment, the one or more electron beam sources generate one or more primary electron beams. For example, the electron beam sources 104a, 104b, 104c, 104d may generate primary electron beams 106a, 106b, 106c, 106d. In another embodiment, the one or more primary electron beams are directed (e.g., focus or steered) to the one or more electron-optical columns of the electron-optical column array 108. For example, the primary electron beams 106a, 106b, 106c, 106d may be directed to the electron-optical columns 110a, 110b, 110c, 110d of the electron-optical column array 108. In another embodiment, the one or more electron beam sources generate an electron beam that is split and directed to two or more electron-optical columns of the electron-optical column array 108 via one or more source electron-optical elements in the electron beam source array 102.

In another embodiment, the one or more electron-optical columns include one or more electron-optical elements. For example, the electron-optical columns 110a, 110b, 110c, 110d may include electron-optical elements 112a, 112b, 112c, 112d. By way of another example, the one or more electron-optical elements may include, but are not limited to, one or more electrostatic lenses, one or more electromagnetic lenses, or the like.

In another embodiment, the one or more electron-optical columns direct the one or more primary electron beams to a sample 114 secured on a sample stage 116. For example, the electron-optical columns 110a, 110b, 110c, 110d may direct the primary electron beams 106a, 106b, 106c, 106d onto the sample 114 secured on the sample stage 116. In another embodiment, the sample 114 may emit and/or backscatter one or more secondary electron beams in response to the one or more primary electron beams impinging on the sample 114. For example, the sample 114 may emit and/or backscatter secondary electron beams 118a, 118b, 118c, 118d in response to the primary electron beams 106a, 106b, 106c, 106d impinging on the sample 114. For instance, the sample 114 may emit secondary electrons in response to the primary electron beams 106a, 106b, 106c, 106d. In addition, the sample 114 may backscatter electrons from the primary electron beams 106a, 106b, 106c, 106d.

It is noted herein that the electrons within the secondary electron beams 118a, 118b, 118c, 118d may be slower than the electrons within the primary electron beams 106a, 106b, 106c, 106d, as the secondary electron beams 118a, 118b, 118c, 118d are wider than the primary electron beams 106a, 106b, 106c, 106d. In addition, it is noted herein that the electrons in the secondary electron beams 118a, 118b, 118c, 118d may be slower than the electrons in the primary electron beams 106a, 106b, 106c, 106d, as energy equivalent to the landing energy may have been lost by the electrons within the primary electron beams 106a, 106b, 106c, 106d when emitted and/or backscattered to form the secondary electron beams 118a, 118b, 118c, 118d.

The sample 114 may include any sample suitable for inspection and/or review. For example, the sample 114 may include, but is not limited to, a photomask/reticle, semiconductor wafer, or the like. As used through the present disclosure, the term "wafer" refers to a substrate formed of a semiconductor and/or a non-semiconductor material. For instance, in the case of a semiconductor material, the wafer may be formed from, but is not limited to, monocrystalline silicon, gallium arsenide, and/or indium phosphide. As such, the term "wafer" and the term "sample" may be used interchangeably in the present disclosure. Therefore, the above description should not be interpreted as a limitation on the scope of the present disclosure but merely an illustration. It is noted herein that many different types of devices may be formed on a wafer, and the term wafer as used herein is intended to encompass a wafer on which any type of device known in the art is being fabricated. Therefore, the above description should not be interpreted as a limitation on the scope of the present disclosure but merely an illustration.

The sample stage 116 may include any appropriate mechanical and/or robotic assembly known in the art of electron beam microscopy. In one embodiment, the sample stage 116 is an actuatable stage. For example, the sample stage 116 may include, but is not limited to, one or more translational stages suitable for selectively translating the sample 114 along one or more linear directions (e.g., x-direction, y-direction, and/or z-direction). By way of another example, the sample stage 116 may include, but is not limited to, one or more rotational stages suitable for selectively rotating the sample 114 along a rotational direction. By way of another example, the sample stage 116 may include, but is not limited to, a rotational stage and a translational stage suitable for selectively translating the sample 114 along a linear direction and/or rotating the sample 114 along a rotational direction. By way of another example, the sample stage 116 may be configured to translate or rotate the sample 114 for positioning, focusing, and/or scanning in accordance with a selected inspection or metrology algorithm, several of which are known to the art.

FIG. 2 illustrates a simplified schematic view of an electron-optical column 110a of the SEM characterization tool 100, in accordance with one or more embodiments of the present disclosure.

Although embodiments of the present disclosure are directed to generating the one or more secondary electron beams 118a via the one or more primary electron beams 106a impinging on the surface of the sample 114, it is noted herein the one or more primary electron beams 106a have been removed from FIG. 2 for the sake of clarity. However, it is noted herein that the one or more primary electron beams 106a may be directed to the sample 114 in such a way so as to not affect collection of the one or more secondary electron beams 118a travelling the opposite way through the electron-optical column 110a. Therefore, the above description should not be interpreted as a limitation on the scope of the present disclosure but merely an illustration.

It is noted herein that any description of the primary electron beam 106a may be extended to the primary electron beams 106b, 106c, 106d, for purposes of the present disclosure. In addition, it is noted herein that any description of the electron-optical column 110a may be extended to the electron-optical columns 110b, 110c, 110d, for purposes of the present disclosure. Further, it is noted herein that any description of the electron-optical elements 112a may be extended to the electron-optical elements 112b, 112c, 112d, for purposes of the present disclosure. Further, it is noted herein that any description of the secondary electron beam 118a may be extended to the secondary electron beams 118b, 118c, 118d, for purposes of the present disclosure. Therefore, the above description should not be interpreted as a limitation on the scope of the present disclosure but merely an illustration.

In one embodiment, the electron-optical column 110a includes one or more detectors 200 configured for detecting the one or more secondary electron beams 118a from the sample 114. For example, the one or more detectors 200 may include, but are not limited to, one or more secondary electron detectors. By way of another example, the one or more detectors 200 may include, but are not limited to, one or more backscattered electron detectors. For the purposes of simplicity, the remainder of the present disclosure discusses the various embodiments of the present disclosure in the context of secondary electron detection. However, it is recognized herein the electron-optical column 110a may be configured for detection of secondary electrons and/or backscattered electrons from the sample 114. As such, the scope of the present disclosure should not be interpreted as being limited to the detection of secondary electrons and should be considered to encompass the detection of secondary electrons and/or backscattered electrons.

In another embodiment, the one or more electron-optical elements 112a include a deflector stack including one or more deflectors. For example, a deflector may be an octupole deflector (e.g., including eight plates), a quadrupole deflector (e.g., including four plates), or the like. In another embodiment, the deflector stack includes one or more deflection layers, where a deflection layer includes one or more deflectors. For example, a deflection layer may include one or more pairs of deflectors. For instance, a deflection layer may include one or more pairs of octupole deflectors; one or more pairs of quadrupole deflectors; or a combination of one or more pairs of octupole deflectors and one or more pairs of quadrupole deflectors. In another embodiment, a deflection layer may have a deflection ratio that quantifies deflection aberration for the deflector pair.

In another embodiment, the electron-optical column 110a includes one or more voltage lines corresponding to the number of deflectors within the electron-optical column 110a. For example, where the one or more electron-optical elements 112a includes four octupole deflectors, the electron-optical column 110a includes thirty-two voltage lines for the four octupole deflectors. In another embodiment, deflectors within the one or more electron-optical elements 112a form a deflection layer or deflector pair based on operating voltage.

In another embodiment, a deflection layer includes an upper deflector 202 and a lower deflector 204. In another embodiment, the upper deflector 202 and the lower deflector 204 are configured to perform one or more of double deflection and/or dynamic stigmation. In another embodiment, the upper deflector 202 and the lower deflector 204 are of a select thickness that double deflection is possible while applying an identical voltage to the upper deflector 202 and the lower deflector 204. For example, where the upper deflector 202 and the lower deflector 204 are octupole deflectors, sixteen voltage lines may be required. It is noted herein that a set of deflector pairs including the upper deflector 202 and the lower deflector 204 may be considered a deflector layer, for purposes of the present disclosure.

In another embodiment, a deflection layer includes an upper trim deflector 206 and a lower trim deflector 208. In another embodiment, the upper trim deflector 206 and the lower trim deflector 208 are configured to perform one or more of static deflection, static stigmation, dynamic deflection, and/or dynamic stigmation. It is noted herein that a deflector layer including the upper trim deflector 206 and the lower trim deflector 208 may be considered a trim deflector layer, for purposes of the present disclosure.

In another embodiment, the upper deflector 202 is coupled to one or more amplifiers 210. In another embodiment, the lower deflector 204 is coupled to one or more amplifiers 212. In another embodiment, the upper trim deflector 206 is coupled to one or more amplifiers 214. In another embodiment, the lower trim deflector 208 is coupled to one or more amplifiers 216.

For example, the deflector layer and the trim deflector layer may be designed such that generated deflection exceeds the capability of a deflector 202, 204, 206, 208 and the corresponding amplifiers 210, 212, 214, 216, respectively. In this regard, multiple deflection layers may be stacked to combine and increase an amount of deflection possible by the one or more electron-optical elements 112a in the electron-optical column 110a. Therefore, the above description should not be interpreted as a limitation on the scope of the present disclosure but merely an illustration.

By way of another example, the deflector layer including the upper deflector 202 and the lower deflector 204 may operate at a high voltage and the trim deflector layer including the upper trim deflector 206 and the lower trim deflector 208 may operate at a low voltage. In this example, the upper deflector 202 and the lower deflector 204 may be considered a high voltage deflector pair, for purposes of the present disclosure. In addition, in this example the upper trim deflector 206 and the lower trim deflector 208 may be considered a low voltage deflector pair, for purposes of the present disclosure. It is noted herein, however, that the trim deflector layer including the upper trim deflector 206 and the lower trim deflector 208 may operate at a voltage equal to or higher than the deflector layer including the upper deflector 202 and the lower deflector 204. Therefore, the above description should not be interpreted as a limitation on the scope of the present disclosure but merely an illustration.

Referring generally to FIGS. 1 and 2, where the electron-optical column 108 includes the electron-optical columns 110a, 110b, 110c, 110d, in one embodiment splitting the voltage into high and low deflector sets allows for the reduction of electrical components in the electron-optical column array 108. For example, where the upper deflector 202 is an octupole deflector, the signal for each plate of the upper deflector 202 in the electron-optical column 110a may utilize and/or be driven by a common controller or common amplifier 210, such that a total of eight amplifiers 210 or common controllers are coupled to each upper deflector 202 of the electron-optical columns 110b, 110c, 110d. By way of another example, where the lower deflector 204 is an octupole deflector, the signal for each plate of the lower deflector 204 in the one or more electron-optical columns 110a may utilize and/or be driven by a common controller or a common amplifier 212, such that a total of eight amplifiers 212 or common controllers are coupled to each lower deflector 204 of the electron-optical columns 110b, 110c, 110d.

It is noted herein that utilizing a common amplifier for each respective deflector plate of the upper deflector 202 and the lower deflector 204 is made possible due to the non-common static settings and/or a portion of dynamic deflection being split off to the trim deflector layer. For example, each plate of the upper trim deflector 206 may be individually-driven and/or individually-adjusted via a controller or an amplifier 214, such that the electron-optical columns 110a, 110b, 110c, 110d includes a number of controllers or amplifiers 214 up to the number of plates in the upper trim deflector 206. By way of another example, each plate of the lower trim deflector 208 is individually-driven and/or individually-adjusted via a controller or an amplifier 216, such that the electron-optical columns 110a, 110b, 110c, 110d includes a number of controllers or amplifiers 216 up to the number of plates in the lower trim deflector 208.

In addition, it is noted herein the amplifiers 210, 212 and corresponding connectors coupled to the upper deflector 202 and the lower deflector 204, respectively may be larger (e.g., due to a higher operating voltage) than the amplifiers 214, 216 and corresponding connectors coupled to the upper trim deflector 206 and the lower trim deflector 208, respectively. In addition, it is noted herein that the smaller amplifiers 214, 216 may be more densely routed, cabled, and/or packaged, and may consume less power, than the larger amplifiers 210, 212.

In this regard, the one or more amplifiers 210 or common controllers and the one or more amplifiers 212 or common controllers coupled to upper deflector 202 and the lower deflector 204, respectively, may operate as a common driver for the deflector layers including the upper deflector 202 and the lower deflectors 204 across the one or more electron-optical columns 110a, 110b, 110c, 110d within the electron-optical column array 108. In addition, the one or more amplifiers 214 or controllers and the one or more amplifiers 216 or controllers coupled to the upper trim deflector 206 and the lower trim deflector 208, respectively, may operate as smaller individual drivers for the trim deflector layers including the upper trim deflector 206 and the lower trim deflector 208 for purposes of fine-tuning the one or more secondary electron beams 118a, 118b, 118c, 118d. As such, volume, complexity, and power consumption of the SEM characterization tool 100 may be reduced as a whole.

Although embodiments of the present disclosure are directed to the upper deflector 202 and the lower deflector 204 being coupled to the amplifiers 210, 212, respectively, it is noted herein that the upper deflector 202 and the lower deflector 204 may be coupled to single set of common amplifiers. In this regard, the upper deflectors 202 and the lower deflectors 204 may be commonly-coupled across the electron-optical columns 110a, 110b, 110c, 110d. Therefore, the above description should not be interpreted as a limitation on the scope of the present disclosure but merely an illustration.

Referring again to FIG. 2, in one embodiment the deflector layer and the trim deflector layer are arranged such that they form an electron beam channel of a selected shape, where the electron beam channel is centered about an axis through the one or more electron-optical elements 112a of the electron-optical column 110a. For example, the shape of the electron beam channel may be selected to improve (e.g., increase and/or maximize) the deflection sensitivity of the electron-optical column 110a without affecting (e.g., decreasing and/or lowering) the collection of the or more secondary electron beams 118a. For instance, improving the deflection sensitivity may include selecting a shape that allows the one or more secondary electron beams 118a to travel back up the electron beam channel as close to the one or more electron-optical elements 112a as possible without colliding with the one or more electron-optical elements 112a. It is noted herein that improving the deflection sensitivity of the electron-optical column 110a without affecting the secondary electron beam 118a collection is important for low-voltage deflector pairs.

By way of another example, the electron beam channel may be conical, including a narrow end and a wide end, where the conical electron beam channel may be formed via one or more design constraints of the one or more electron-optical elements 112a within the electron-optical column 110a.

For instance, the conical electron beam channel may be formed via a conical opening in one or more electron-optical elements 112a. The conical opening may be defined by an inclined/sloped inner surface of the one or more electron-optical elements 112a, where the incline/slope is based on an angle from the central axis through the one or more electron-optical elements 112a. One or more of the upper deflector 202, the lower deflector 204, the upper trim deflector 206, and/or the lower trim deflector 208 may include an inclined/sloped inner surface.

In addition, the conical electron beam channel may be formed via an inner surface of a first electron-optical element 112a and an inner surface of at least an additional electron-optical element 112a. The inner surface of the first electron-optical element 112a and the at least the additional electron-optical element 112a may each be set a selected distance (e.g., either a different selected distance or the same selected distance) from the central axis through the electron-optical elements 112a. One or more of the upper deflector 202, the lower deflector 204, the upper trim deflector 206, and/or the lower trim deflector 208 may include an inner surface set a selected distance from the central axis.

Further, the conical electron beam channel may be formed via a combination of a conical opening in an electron-optical element 112a and via inner surfaces of a first electron-optical element 112a and at least an additional election-optical element 112a set a selected distance from the central axis.

By way of another example, the shape of the electron beam channel may be tuned based on a component of the SEM characterization tool 100. For instance, the narrow end of the channel may be tuned to the size of the one or more secondary electron beams 118a. In addition, the wide end of the channel may be tuned to the size of the one or more secondary electron detectors 200.

In another embodiment, the upper deflector 202, the lower deflector 204, the upper trim deflector 206, and/or the lower trim deflector 208 may be spaced within the deflector stack of the electron-optical column 110a to compensate for the deflection ratio. For example, the upper deflector 202 and the upper trim deflector 206 may be spaced to compensate for the deflection ratio.

By way of another example, the spacing between one or more of the upper deflector 202, the lower deflector 204, the upper trim deflector 206, and/or the lower trim deflector 208 may be either increased or decreased to compensate for the deflection ratio.

For instance, the one or more primary electron beams 106a may be directed through a deflector stack including the upper deflector 202, the upper trim deflector 206, the lower trim deflector 208, and the lower deflector 204 in order. In addition, the one or more secondary electron beams 118a may be directed through a deflector stack including the secondary electron beam is directed through the lower deflector 204, the lower trim deflector 208, the upper trim deflector 206, and the upper deflector 202 in order. It is noted herein that placing the upper deflector 202 and the lower deflector 204 at the top and bottom of the deflector stack may improve (e.g., increase and/or maximize) the deflection arm for a given electron-optical column 110a length. In turn, this may reduce and/or minimize the deflection (e.g., kick) of the primary electron beam 106a at the lower deflector 204 for a selected deflection length of the one or more secondary electron beams 118a. Reducing and/or minimizing the deflection (e.g., kick) of the one or more primary electron beams 106a travelling down through the one or more electron-optical elements 112a at the lower deflector 204 may subsequently reduce and/or minimize the deflection of the one or more secondary electron beams 118a travelling back up through the one or more electron-optical elements 112a. In this regard, the deflection of the secondary electron beams 118a that produces a signal at the one or more secondary electron detectors 200 may be increased and/or maximized.

By way of another example, the thickness of one or more of the upper deflector 202, the lower deflector 204, the upper trim deflector 206, and/or the lower trim deflector 208 may be either increased or decreased to compensate for the deflection ratio. For instance, the upper deflector 202, the lower deflector 204, the upper trim deflector 206, and/or the lower trim deflector 208 may be of a selected thickness, such that the upper deflector 202 and the lower deflector 204 may be substantially less thick (e.g., thinner, flatter, or shorter in height) than the upper trim deflector 206 and the lower trim deflector 208. The upper deflector 202 and the lower deflector 204 may be operable at a decreased thickness due to the high voltage. In contrast, the upper trim deflector 206 and the lower trim deflector 208 may substantially fill the space of the deflector stack (and, more generally, the space of the electron-optical column 110a) to utilize a provided low voltage. It is noted herein, however, that the upper deflector 202 and the lower deflector 204 may be the same thickness or a greater thickness than the upper trim deflector 206 and/or the lower trim deflector 208. Therefore, the above description should not be interpreted as a limitation on the scope of the present disclosure but merely an illustration.

It is noted herein that any of the examples provided may be combined to compensate for the deflection ratio. Therefore, the above description should not be interpreted as a limitation on the scope of the present disclosure but merely an illustration.

In one embodiment, the one or more electron-optical elements 112a include one or more objective lenses 218. For example, the one or more objective lenses 218 may include, but are not limited to, a dynamic focus (DF) lens. For instance, the DF lens may include a weak, adjustable lens configured to keep the one or more primary electron beams 106a in focus when the sample 114 is scanned sideways to compensate for varying focus height. By way of another example, the one or more objective lenses 218 may include, but are not limited to, a lower pole (LP) lens. For instance, the LP lens may include a decelerating magnetic immersion lens configured to provide a selected level of electron-optical performance in combination with a long working distance to the sample 114 during scanning. In another embodiment, the one or more primary electron beams 106a are directed through the one or more objective lenses 218 via the deflector stack.

In another embodiment, misalignment of the electron-optical column 110a is adjusted for (or corrected) via the deflector stack. For example, small misalignments of the electron-optical column 110a may be adjusted for (or corrected) via a double deflection process, such that the beam is steered through the one or more objective lenses 218 on the central axis and parallel to the central axis. By way of another example, large misalignments of the electron-optical column 110a may be adjusted for via a single deflection process, such that the beam is steered through the one or more objective lenses 218 on the central axis and at an angle.

In one embodiment, one or more primary electron beams 106a are directed to the sample 114 via the conical electron beam channel of the electron-optical column 110a of the SEM characterization tool 100. For example, the one or more primary electron beam 106a may travel through the electron-optical channel of the electron-optical column 110a. The one or more primary electron beams 106a may be double deflected by the upper deflector 202 and the lower deflector 204. The one or more primary electron beams 106a may be dynamically stigmated by the lower trim deflector 208. The one or more primary electron beams 106a may be statically stigmated and/or deflected by the upper trim deflector 206 and the lower trim deflector 208. The one or more objective lenses 218 may direct the one or more primary electron beams 106a onto the sample 114, such that the one or more secondary electron beams 118a may be generated from electrons emitted and/or backscattered from the one or more primary electron beams 106a. In this regard, the spot size at the sample 114 over a field of view may be improved.

In one embodiment, the one or more secondary electron beams 114a are directed to the one or more secondary electron detectors 200 via the conical electron beam channel of the electron-optical column 110a of the SEM characterization tool 100. For example, the one or more secondary electron beams 118a may travel back through the electron-optical channel of the electron-optical column 110. For instance, the one or more secondary electron beams 118a may be deflected by the lower deflector 204 to cause the one or more secondary electron beams 118a to travel parallel to the shape of the electron beam channel (e.g., parallel to a conical surface) through the deflector stack. In this regard, the deflection field of view may be improved.

It is noted herein that the present disclosure is not limited to utilizing sets of electron-optical deflectors in a common mode and an individual mode in an electron-optical column of an SEM characterization tool. For example, sets of optical deflectors may be utilized in a common mode and an individual mode in a characterization tool. Therefore, the above description should not be interpreted as a limitation on the scope of the present disclosure, but merely an illustration.

While the present disclosure generally focuses on a multi-column SEM characterization tool, the scope of the present disclosure should not be interpreted as limiting to such a configuration. Rather, it is recognized herein that the various embodiments of the present disclosure may be extended to any type of electron-based characterization tool including, but not limited to, a secondary electron (SE) characterization tool, a multi-beam SEM characterization tool, or the like.

While the present disclosure generally focuses on an electron-based characterization tool, the scope of the present disclosure should not be interpreted as limiting to such a configuration. Rather, it is recognized herein that the various embodiments of the present disclosure may be extended to any type of characterization tool known in the art including, but not limited to, a focused ion beam (FIB) characterization tool or an optical characterization tool.

Figure 3:
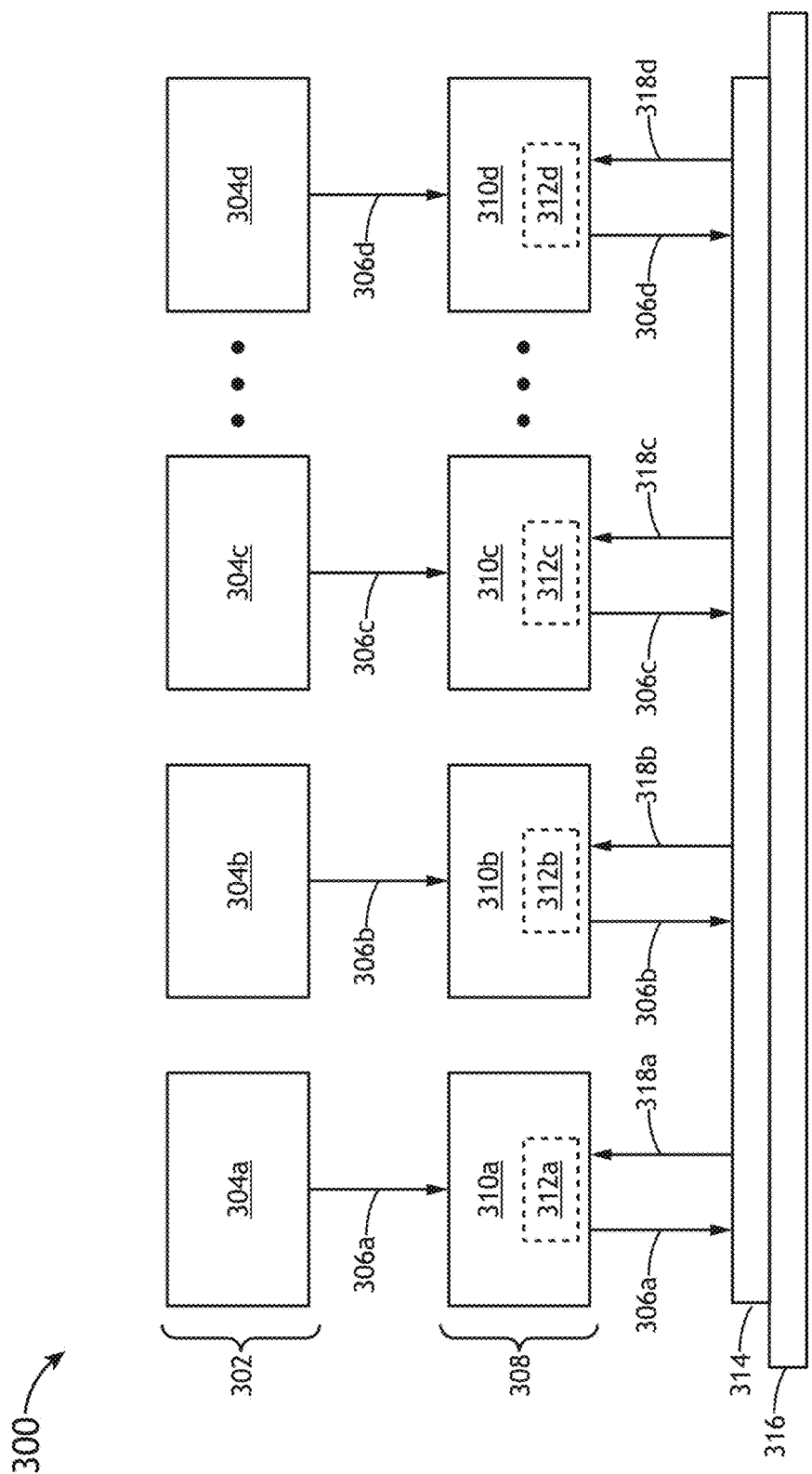
FIG. 3 illustrates a simplified block diagram of an optical characterization tool, in accordance with one or more embodiments of the present disclosure.

FIG. 3 illustrates a simplified schematic view of an optical characterization tool 300, in accordance with one or more embodiments of the present disclosure.

In one embodiment, the optical characterization tool 300 may include any optical characterization tool known in the art. For example, the optical characterization tool 300 may include an optical characterization tool capable of operating at a wavelength corresponding to, but not limited to, visible light, UV radiation, DUV radiation, VUV radiation, EUV radiation, and/or X-ray radiation.

In another embodiment, the optical characterization tool 300 includes a radiation source array 302. In another embodiment, the radiation source array 302 includes one or more radiation sources. For example, the radiation source array 302 may include, but is not limited to, a first radiation source 304a, a second radiation source 304b, a third radiation sources 304c, and/or at least a fourth radiation source 304d.

In another embodiment, the optical characterization tool 300 includes an optical column array 308. In another embodiment, the optical column array 308 includes one or more optical columns. For example, the optical column array 308 may include, but is not limited to, a first optical column 310a, a second optical column 310b, a third optical column 310c, and/or at least a fourth optical column 310d.

In another embodiment, the one or more radiation sources generate one or more primary radiation beams. For example, the radiation sources 304a, 304b, 304c, 304d may generate primary radiation beams 306a, 306b, 306c, 306d. In another embodiment, the one or more primary radiation beams are directed to the one or more optical columns of the optical column array 308. For example, the one or more primary radiation beams 306a, 306b, 306c, 306d may be directed to the optical columns 310a, 310b, 310c, 310d of the optical column array 308. In another embodiment, the one or more radiation sources generates a radiation beam that is split and directed to two or more optical columns of the optical column array 308 via one or more source optical elements in the illumination beam source array 302.

In another embodiment, the one or more optical columns include one or more optical elements. For example, the optical columns 310a, 310b, 310c, 310d may include optical elements 312a, 312b, 312c, 312d. By way of another example, the one or more optical elements may include, but are not limited to, an optical deflector layer, an optical trim deflector layer, or the like. For instance, one or more of the optical deflector layer or the optical trim deflector layer may include one or more optical deflectors, where the one or more optical deflectors may include, but are not limited to, one or more prisms, one or more acousto-optic modulators, or the like.

In another embodiment, the one or more optical deflectors within the optical deflection layer are configured to perform one or more of double deflection and/or dynamic stigmation. In another embodiment, the optical trim deflector layer includes one or more optical trim deflectors. In another embodiment, the optical trim deflectors within the optical trim deflector layer are configured to perform one or more of static deflection, static stigmation, dynamic deflection, and/or dynamic stigmation.

In another embodiment, the optical deflector layer operates at a high voltage and the optical trim deflector layer operates at a low voltage. It is noted herein, however, that the optical trim deflector layer may operate at a voltage equal to or higher than the optical deflector layer. Therefore, the above description should not be interpreted as a limitation on the scope of the present disclosure but merely an illustration.

In another embodiment, the one or more optical deflectors within the optical deflector layer of an optical column (e.g., optical column 310a) are coupled to an amplifier or common controller, such that a selected number of amplifiers are coupled to the optical deflectors within the optical deflector layers of additional optical columns (e.g., optical columns 310b, 310c, 310d) within the optical column array 308. It is noted herein that utilizing a common amplifier for each respective optical deflector is made possible due to the static settings and/or a portion of dynamic deflection being split off to the optical trim deflector layer. For example, optical trim deflectors in the optical trim deflector layers may be individually-driven and/or individually-adjusted via a controller or an amplifier within a particular optical column (e.g., optical column 310a, 310b, 310c, 310d) of the optical column array 308.

It is noted herein the amplifiers and corresponding connectors coupled to the optical deflectors within the optical deflector layer may be larger (e.g., due to a higher operating voltage) than the amplifiers and corresponding connectors coupled to the optical trim deflectors within the optical trim deflector layer. In addition, it is noted herein that the smaller amplifiers may be more densely routed, cabled, and/or packaged, and may consume less power, than the larger amplifiers.

In this regard, the one or more amplifiers or common controllers coupled to the optical deflectors within the optical deflector layer may operate as a common driver for the optical deflectors within the optical deflector layers across the one or more optical columns (e.g., optical columns 310a, 310b, 310c, 310d) within the optical column array 308. In addition, the one or more amplifiers or controllers coupled to the optical trim deflectors within the optical trim deflector layers may operate as smaller individual drivers for the optical trim deflectors within the optical trim deflector layers of the one or more optical columns (e.g., optical columns 310a, 310b, 310c, 310d) of the optical column array 108 for purposes of fine-tuning one or more secondary beams of radiation (e.g., secondary beams of radiation 318a, 318b, 318c, 318d), where the one or more secondary beams of radiation are generated by the one or more primary radiation beams (e.g., primary radiation beams 306a, 306b, 306c, 306d) impinging on a sample 314. As such, volume, complexity, and power consumption of the optical characterization tool 300 may be reduced as a whole.

In one embodiment, the optical deflector layer and the optical trim deflector layer are arranged such that they form an optical beam channel of a selected shape, where the optical beam channel is centered about an axis through the one or more optical elements (e.g., optical elements 312a, 312b, 312c, 312d) of the one or more optical columns (e.g., optical columns 310a, 3110b, 310c, 310d) of the optical column array 308. For example, the shape of the optical beam channel may be conical, including a narrow end and a wide end, where the conical optical beam channel may be formed via one or more design constraints of the one or more optical elements (e.g., optical elements 312a, 312b, 312c, 312d) of the one or more optical columns (e.g., optical columns 310a, 310b, 310c, 310d) of the optical column array 308. For instance, the conical electron beam channel may be formed via a conical opening in one or more electron-optical elements (e.g., optical elements 312a, 312b, 312c, 312d). The conical opening may be defined by an inclined/sloped inner surface of the one or more electron-optical elements (e.g., optical elements 312a, 312b, 312c, 312d), where the incline/slope is based on an angle from the central axis through the one or more electron-optical elements (e.g., optical elements 312a, 312b, 312c, 312d). It is noted herein that any description of the shape or operation of the electron beam channel through the one or more electron-optical columns (e.g., electron-optical columns 110a, 110b, 110c, 110d) of the electron-optical column array 108 may be extended to the optical beam channel through the one or more optical columns (e.g., the optical columns 310a, 310b, 310c, 310d) of the optical column array 308, for purposes of the present disclosure. Therefore, the above description should not be interpreted as a limitation on the scope of the present disclosure but merely an illustration.

In another embodiment, the one or more optical columns of the optical column array 308 direct the one or more primary beams of radiation onto the sample 314 secured on the sample stage 316. For example, the optical columns 310a, 310b, 310c, 310d may direct the primary beams of radiation 306a, 306b, 306c, 306d onto the sample 314 secured on the sample stage 316. In another embodiment, the sample 314 generates one or more beams of radiation in response to the one or more primary beams of radiation impinging on the sample 314. For example, the sample 314 may generate one or more secondary beams of radiation 318a, 318b, 318c, 318d in response to the primary beams of radiation 306a, 306b, 306c, 306d impinging on the sample 314.

In another embodiment, the one or more optical columns include one or more optical detectors. For example, the one or more optical columns 310a, 310b, 310c, 310d may include one or more optical detectors. In another embodiment, the one or more optical elements direct the one or more secondary beams of radiation to the one or more optical detectors of the optical columns. For example, the optical elements 312a, 312b, 312c, 312d may direct the secondary beams of radiation 318a, 318b, 318c, 318d to the one or more optical detectors of the optical columns 310a, 310b, 310c, 310d.

It is noted herein that any description of the sample 114 may be extended to the sample 314. In addition, it is noted herein that any description of the sample stage 116 may be extended to the sample stage 316. Therefore, the above description should not be interpreted as a limitation on the scope of the present disclosure but merely an illustration.

It is noted herein that any description of the beam of radiation 306a may be extended to the beams of radiation 306b, 306c, 306d, for purposes of the present disclosure. In addition, it is noted herein that any description of the optical column 310a may be extended to the optical columns 310b, 310c, 310d, for purposes of the present disclosure. Further, it is noted herein that any description of the one or more optical elements 312a may be extended to the one or more optical elements 312b, 312c, 312d, for purposes of the present disclosure. Further, it is noted herein that any description of the secondary beam of radiation 318a may be extended to the secondary beams of radiation 318b, 318c, 318d, for purposes of the present disclosure. Therefore, the above description should not be interpreted as a limitation on the scope of the present disclosure but merely an illustration.

Figure 4:
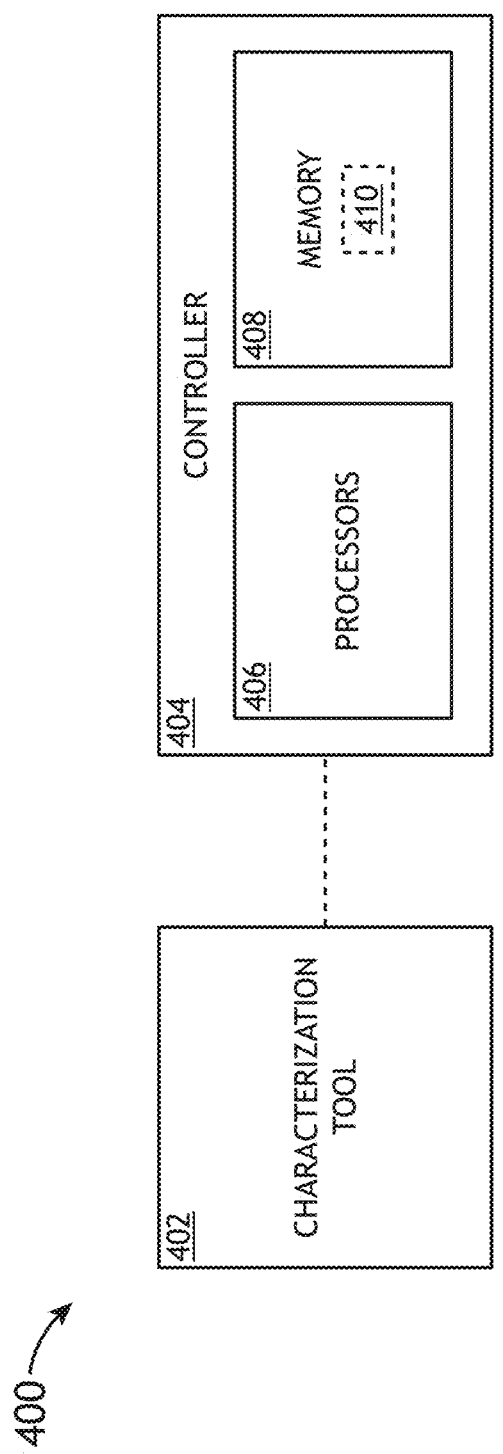
FIG. 4 illustrates a simplified schematic view of a characterization system including a characterization tool and a controller, in accordance with one or more embodiments of the present disclosure.

FIG. 4 illustrates a characterization system 400, in accordance with one or more embodiments of the present disclosure.

In one embodiment, the characterization system 400 includes a characterization tool 402. The characterization system 400 may include any appropriate characterization tool 402 known in the art. In a general sense, the characterization tool 402 may include any characterization tool suitable for characterizing one or more photomasks/reticles or wafers.

In one embodiment, the characterization tool 402 includes one or more characterization tool and/or characterization components configured to characterize one or more photomasks/reticles or wafers known in the art. For example, the characterization tool 402 may include, but is not limited to, the SEM characterization tool 100, the optical characterization tool 300, an FIB characterization tool, or the like. Generally, the characterization tool 402 may include, but is not limited to, an inspection tool, a review tool, an imaging-based overlay metrology tool, or the like.

In another embodiment, the characterization system 400 includes a controller 404. In another embodiment, the controller 404 is operably coupled to one or more components of the characterization tool 402. In this regard, the controller 404 may direct any of the components of the characterization tool 402 to carry out any of the one or more of the various functions described throughout the present disclosure.

In another embodiment, the controller 404 includes one or more processors 406 and memory 408. In another embodiment, the memory 408 stores a set of program instructions 410. In another embodiment, the set of program instructions 410 is configured to cause the one or more processors 406 to carry out any of the one or more process steps described throughout the present disclosure.

The controller 404 may be configured to receive and/or acquire data or information from other systems or tools of the characterization tool 402 by a transmission medium that may include wireline and/or wireless portions. In addition, the controller 404 may be configured to transmit data or information (e.g., the output of one or more procedures of the inventive concepts disclosed herein) to one or more systems or tools of the characterization tool 402 by a transmission medium that may include wireline and/or wireless portions. In this regard, the transmission medium may serve as a data link between the controller 404 and the other subsystems of the characterization tool 402. In addition, the controller 404 may be configured to send data to external systems via a transmission medium (e.g., network connection).

The one or more processors 406 may include any one or more processing elements known in the art. In this sense, the one or more processors 406 may include any microprocessor device configured to execute algorithms and/or program instructions. For example, the one or more processors 406 may consist of a desktop computer, mainframe computer system, workstation, image computer, parallel processor, handheld computer (e.g., tablet, smartphone, or phablet), or other computer system (e.g., networked computer). In general, the term "processor" may be broadly defined to encompass any device having one or more processing elements, which execute the set of program instructions 410 from a non-transitory memory medium (e.g., the memory 408). Moreover, different subsystems of the characterization tool 402 may include processor or logic elements suitable for carrying out at least a portion of the steps described throughout the present disclosure. Therefore, the above description should not be interpreted as a limitation on the present disclosure but merely an illustration.

The memory 408 may include any storage medium known in the art suitable for storing the set of program instructions 410 executable by the associated one or more processors 406. For example, the memory 408 may include a non-transitory memory medium. For instance, the memory 408 may include, but is not limited to, a read-only memory (ROM), a random access memory (RAM), a magnetic or optical memory device (e.g., disk), a magnetic tape, a solid state drive, and the like. The memory 408 may be configured to provide display information to a display device of a user interface. In addition, the memory 408 may be configured to store user input information from a user input device of the user interface. The memory 408 may be housed in a common controller 404 housing with the one or more processors 406. The memory 408 may, alternatively or in addition, be located remotely with respect to the spatial location of the processors 406 and/or the controller 404. For instance, the one or more processors 406 and/or the controller 404 may access a remote memory 408 (e.g., server), accessible through a network (e.g., internet, intranet, and the like).

In another embodiment, data from one or more components of the characterization tool 402 are read back and/or processed by one or more sets of electronics coupled to, and/or software stored on, the controller 404. In another embodiment, images generated by, or from a surface of, one or more components of the characterization tool 402 are read back and/or processed by one or more sets of electronics coupled to, and/or software stored on, the controller 404.

In another embodiment, the characterization system 400 includes a user interface. In another embodiment, the user interface is coupled to the controller 404 (e.g., physically coupled and/or communicatively coupled). In another embodiment, the user interface includes a display. In another embodiment, the user interface includes a user input device. In another embodiment, the display device is coupled to the user input device. For example, the display device may be coupled to the user input device by a transmission medium that may include wireline and/or wireless portions.

While embodiments of the present disclosure illustrate the controller 404 may be coupled to the characterization tool 402 or integrated into the characterization tool 402 as a component, the controller 404 is not an integral or required component of the characterization tool 402. In addition, while embodiments of the present disclosure illustrate a user interface may be coupled to the controller 404 or integrated into the controller 404 as a component, the user interface is not an integral or required component of the controller 404 or the characterization tool 402. Therefore, the above description should not be interpreted as a limitation on the scope of the present disclosure but merely an illustration.

Those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

In some implementations described herein, logic and similar implementations may include software or other control structures. Electronic circuitry, for example, may have one or more paths of electrical current constructed and arranged to implement various functions as described herein. In some implementations, one or more media may be configured to bear a device-detectable implementation when such media hold or transmit device-detectable instructions operable to perform as described herein. In some variants, for example, implementations may include an update or modification of existing software or firmware, or of gate arrays or programmable hardware, such as by performing a reception of or a transmission of one or more instructions in relation to one or more operations described herein. Alternatively or in addition, in some variants, an implementation may include special-purpose hardware, software, firmware components, and/or general-purpose components executing or otherwise invoking special-purpose components. Specifications or other implementations may be transmitted by one or more instances of tangible transmission media as described herein, optionally by packet transmission or otherwise by passing through distributed media at various times.

Alternatively, or additionally, implementations may include executing a special-purpose instruction sequence or invoking circuitry for enabling, triggering, coordinating, requesting, or otherwise causing one or more occurrences of virtually any functional operations described herein. In some variants, operational or other logical descriptions herein may be expressed as source code and compiled or otherwise invoked as an executable instruction sequence. In some contexts, for example, implementations may be provided, in whole or in part, by source code, such as C++, or other code sequences. In other implementations, source or other code implementation, using commercially available and/or techniques in the art, may be compiled/implemented/translated/converted into a high-level descriptor language (e.g., initially implementing described technologies in C, C++, python, Ruby on Rails, Java, PHP, .NET, or Node.js programming language and thereafter converting the programming language implementation into a logic-synthesizable language implementation, a hardware description language implementation, a hardware design simulation implementation, and/or other such similar mode(s) of expression). For example, some or all of a logical expression (e.g., computer programming language implementation) may be manifested as a Verilog-type hardware description (e.g., via Hardware Description Language (HDL) and/or Very High Speed Integrated Circuit Hardware Descriptor Language (VHDL)) or other circuitry model which may then be used to create a physical implementation having hardware (e.g., an Application Specific Integrated Circuit). Those skilled in the art will recognize how to obtain, configure, and optimize suitable transmission or computational elements, material supplies, actuators, or other structures in light of these teachings.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

In a general sense, those skilled in the art will recognize that the various embodiments described herein can be implemented, individually and/or collectively, by various types of electro-mechanical systems having a wide range of electrical components such as hardware, software, firmware, and/or virtually any combination thereof; and a wide range of components that may impart mechanical force or motion such as rigid bodies, spring or torsional bodies, hydraulics, electro-magnetically actuated devices, and/or virtually any combination thereof. Consequently, as used herein "electro-mechanical system" includes, but is not limited to, electrical circuitry operably coupled with a transducer (e.g., an actuator, a motor, a piezoelectric crystal, a Micro Electro Mechanical System (MEMS), etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), electrical circuitry forming a communications device (e.g., a modem, communications switch, optical-electrical equipment, etc.), and/or any non-electrical analog thereto, such as optical or other analogs. Those skilled in the art will also appreciate that examples of electro-mechanical systems include but are not limited to a variety of consumer electronics systems, medical devices, as well as other systems such as motorized transport systems, factory automation systems, security systems, and/or communication/computing systems. Those skilled in the art will recognize that electro-mechanical as used herein is not necessarily limited to a system that has both electrical and mechanical actuation except as context may dictate otherwise.

In a general sense, those skilled in the art will recognize that the various aspects described herein which can be implemented, individually and/or collectively, by a wide range of hardware, software, firmware, and/or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), and/or electrical circuitry forming a communications device (e.g., a modem, communications switch, optical-electrical equipment, etc.). Those having skill in the art will recognize that the subject matter described herein may be implemented in an analog or digital fashion or some combination thereof.

Those skilled in the art will recognize that at least a portion of the devices and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

Although a user is described herein as a single figure, those skilled in the art will appreciate that the user may be representative of a human user, a robotic user (e.g., computational entity), and/or substantially any combination thereof (e.g., a user may be assisted by one or more robotic agents) unless context dictates otherwise. Those skilled in the art will appreciate that, in general, the same may be said of "sender" and/or other entity-oriented terms as such terms are used herein unless context dictates otherwise.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that such terms (e.g., "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B.

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

Although particular embodiments of this invention have been illustrated, it is apparent that various modifications and embodiments of the invention may be made by those skilled in the art without departing from the scope and spirit of the foregoing disclosure. It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Accordingly, the scope of the invention should be limited only by the claims appended hereto.

What is claimed:

1. A scanning electron microscopy (SEM) system, comprising:
   a plurality of electron beam sources, wherein at least some of the electron beam sources are configured to generate a primary electron beam; and
   an electron-optical column array comprising a plurality of electron-optical columns, wherein an electron-optical column of the plurality of electron-optical columns comprises a plurality of electron-optical elements, wherein the plurality of electron-optical elements includes:
      a deflector layer including an upper deflector configured to receive a first voltage and a lower deflector configured to receive an additional voltage, wherein the deflector layer is configured to be driven via a common controller shared by at least some of the plurality of electron-optical columns; and
      a trim deflector layer including an upper trim deflector configured to receive a first trim voltage and a lower trim deflector configured to receive an additional trim voltage, wherein the trim deflector layer is configured to be driven by an individual controller,
   wherein the plurality of electron-optical elements is arranged to form an electron beam channel, wherein the electron beam channel is configured to direct the primary electron beam to a sample secured on a stage, wherein the sample emits an electron beam in response to the primary electron beam,
   wherein the electron-optical column further comprises at least one electron detector, wherein the electron beam channel is configured to direct the electron beam to the at least one electron detector.

2. The system in claim 1, wherein the upper deflector is comprised of two or more plates, wherein the lower deflector is comprised of two or more plates.

3. The system in claim 2, wherein the at least some of the plurality of electron-optical columns comprise:
   a first electron-optical column comprising a first deflector layer including a first upper deflector and a first lower deflector; and
   an additional electron-optical column comprising an additional deflector layer including an additional upper deflector and an additional lower deflector,
   wherein at least some of the plates of the first upper deflector is coupled to a corresponding plate of the additional upper deflector and to a first amplifier,
   wherein at least some of the plates of the first lower deflector is coupled to a corresponding plate of the additional lower deflector and to an additional amplifier.

4. The system in claim 1, wherein the upper deflector and the lower deflector are octupole beam deflectors.

5. The system in claim 1, wherein the upper deflector and the lower deflector perform at least one of dynamic double deflection or dynamic stigmation.

6. The system in claim 1, wherein the upper trim deflector is comprised of two or more plates, wherein the lower trim deflector is comprised of two or more plates.

7. The system in claim 6, wherein at least some of the plates of the upper trim deflector are coupled to an individual amplifier.

8. The system in claim 6, wherein at least some of the plates of the lower trim deflector are coupled to an individual amplifier.

9. The system in claim 1, wherein the upper trim deflector and the lower trim deflector are octupole beam deflectors.

10. The system in claim 1, wherein the upper trim deflector and the lower trim deflector perform at least one of static deflection, static stigmation, dynamic double deflection, or dynamic stigmation.

11. The system in claim 1, wherein the plurality of electron-optical elements is arranged such that the primary electron beam is directed through the upper deflector, the upper trim deflector, the lower trim deflector, and the lower deflector.

12. The system in claim 1, wherein the plurality of electron-optical elements is arranged such that the electron beam is directed through the lower deflector, the lower trim deflector, the upper trim deflector, and the upper deflector.

13. The system in claim 1, wherein the plurality of electron-optical elements comprises one or more objective lenses.

14. The system in claim 1, wherein the plurality of electron-optical elements is arranged to form a conical electron beam channel.

15. The system in claim 14, wherein the conical electron beam channel is formed via a conical opening in at least one electron-optical element of the plurality of electron-optical elements.

16. The system in claim 14, wherein the conical electron beam channel is formed via an inner surface of a first electron-optical element and an inner surface of at least an additional electron-optical element of the plurality of electron-optical elements, wherein the inner surface of the first electron-optical element and the inner surface of the at least the additional electron-optical element are each set a selected distance from a central axis through the plurality of electron-optical elements, wherein at least one of the inner surface of the first electron-optical element or the inner surface of the at least the additional electron-optical element includes a sloped inner surface based on an angle relative to the central axis through the plurality of electron-optical elements.

17. The system in claim 16, wherein the selected distance from the central axis to the inner surface of the first electron-optical element is different from the selected distance from the central axis to the inner surface of the at least the additional electron-optical element.

18. The system in claim 14, wherein the conical electron beam channel is formed via a conical opening in at least one electron-optical element of the plurality of electron-optical elements and via an inner surface of a first electron-optical element and an inner surface of at least an additional electron-optical element of the plurality of electron-optical elements,
   wherein the inner surface of the first electron-optical element and the at least the additional electron-optical element are each set a selected distance from the central axis through the plurality of electron-optical elements.

19. The system in claim 14, wherein the conical electron beam channel narrows as the primary electron beam is directed to the sample.

20. The system in claim 19, wherein a narrow opening of the conical electron beam channel is tuned to a size of the electron beam.

21. The system in claim 14, wherein the conical electron beam channel widens as the electron beam is directed to the at least one electron detector.

22. The system in claim 21, wherein a wide opening of the conical electron beam channel is tuned to a size of the at least one electron detector.

23. An electron-optical system, comprising:
an electron-optical column array including a plurality of electron-optical columns, wherein an electron-optical column of the plurality of electron-optical columns includes a plurality of electron-optical elements, wherein the plurality of electron-optical elements includes:
a deflector layer including an upper deflector configured to receive a first voltage and a lower deflector configured to receive an additional voltage, wherein the deflector layer is configured to be driven via a common controller shared by at least some of the plurality of electron-optical columns; and
a trim deflector layer including an upper trim deflector configured to receive a first trim voltage and a lower trim deflector configured to receive an additional trim voltage, wherein the trim deflector layer is configured to be driven by an individual controller,
wherein the plurality of electron-optical elements is arranged to form an electron beam channel, wherein the electron beam channel is configured to direct a primary electron beam to a sample secured on a stage, wherein the sample emits an electron beam in response to the primary electron beam; and
wherein the electron-optical column further comprises at least one electron detector, wherein the electron beam channel is configured to direct the electron beam to the at least one electron detector.

24. A scanning electron microscopy (SEM) system, comprising:
a plurality of electron beam sources, wherein at least some of the electron beam sources are configured to generate a primary electron beam; and
an electron-optical column array comprising a plurality of electron-optical columns, wherein an electron-optical column of the plurality of electron-optical columns includes:
a plurality of electron-optical elements, wherein the plurality of electron-optical elements is arranged to form a conical electron beam channel, wherein the conical electron beam channel is configured to direct the primary electron beam to a sample secured on a stage, wherein the sample emits an electron beam in response to the primary electron beam; and
at least one electron detector, wherein the conical electron beam channel is configured to direct the electron beam to the at least one electron detector.

25. The system in claim 24, wherein the conical electron beam channel is formed via a conical opening in at least one electron-optical element of the plurality of electron-optical elements.

26. The system in claim 24, wherein the conical electron beam channel is formed via an inner surface of a first electron-optical element and an inner surface of at least an additional electron-optical element of the plurality of electron-optical elements, wherein the inner surface of the first electron-optical element and the inner surface of the at least the additional electron-optical element are each set a selected distance from a central axis through the plurality of electron-optical elements, wherein at least one of the inner surface of the first electron-optical element or the inner surface of the at least the additional electron-optical element includes a sloped inner surface based on an angle relative to the central axis through the plurality of electron-optical elements.

27. The system in claim 26, wherein the selected distance from the central axis to the inner surface of the first electron-optical element is different from the selected distance from the central axis to the inner surface of the at least the additional electron-optical element.

28. The system in claim 24, wherein the conical electron beam channel is formed via a conical opening in at least one electron-optical element of the plurality of electron-optical elements and via an inner surface of a first electron-optical element and an inner surface of at least an additional electron-optical element of the plurality of electron-optical elements,
wherein the inner surface of the first electron-optical element and the at least the additional electron-optical element are each set a selected distance from the central axis through the plurality of electron-optical elements.

29. The system in claim 24, wherein the conical electron beam channel narrows as the primary electron beam is directed to the sample.

30. The system in claim 29, wherein a narrow opening of the conical electron beam channel is tuned to a size of the electron beam.

31. The system in claim 24, wherein the conical electron beam channel widens as the electron beam is directed to the at least one electron detector.

32. The system in claim 31, wherein a wide opening of the conical electron beam channel is tuned to a size of the at least one electron detector.

33. The system in claim 24, wherein the plurality of electron-optical elements includes:
a deflector layer including an upper deflector configured to receive a first voltage and a lower deflector configured to receive an additional voltage, wherein the deflector layer is configured to be driven via a common controller shared by at least some of the plurality of electron-optical columns; and
a trim deflector layer including an upper trim deflector configured to receive a first trim voltage and a lower trim deflector configured to receive an additional trim voltage, wherein the trim deflector layer is configured to be driven by an individual controller.

34. The system in claim 33, wherein the upper deflector is comprised of two or more plates, wherein the lower deflector is comprised of two or more plates.

35. The system in claim 34, wherein the at least some of the plurality of electron-optical columns comprise:
a first electron-optical column comprising a first deflector layer including a first upper deflector and a first lower deflector; and
an additional electron-optical column comprising an additional deflector layer including an additional upper deflector and an additional lower deflector,
wherein at least some of the plates of the first upper deflector is coupled to a corresponding plate of the additional upper deflector and to a first amplifier,
wherein at least some of the plates of the first lower deflector is coupled to a corresponding plate of the additional lower deflector and to an additional amplifier.

36. The system in claim 33, wherein the upper deflector and the lower deflector are octupole beam deflectors.

37. The system in claim 33, wherein the upper deflector and the lower deflector perform at least one of dynamic double deflection or dynamic stigmation.

38. The system in claim 33, wherein the upper trim deflector is comprised of two or more plates, wherein the lower trim deflector is comprised of two or more plates.

39. The system in claim 38, wherein at least some of the plates of the upper trim deflector are coupled to an individual amplifier.

40. The system in claim 38, wherein at least some of the plates of the lower trim deflector are coupled to an individual amplifier.

41. The system in claim 33, wherein the upper trim deflector and the lower trim deflector are octupole beam deflectors.

42. The system in claim 33, wherein the upper trim deflector and the lower trim deflector perform at least one of static deflection, static stigmation, dynamic double deflection, or dynamic stigmation.

43. The system in claim 33, wherein the plurality of electron-optical elements is arranged such that the primary electron beam is directed through the upper deflector, the upper trim deflector, the lower trim deflector, and the lower deflector.

44. The system in claim 33, wherein the plurality of electron-optical elements is arranged such that the electron beam is directed through the lower deflector, the lower trim deflector, the upper trim deflector, and the upper deflector.

45. The system in claim 24, wherein the plurality of electron-optical elements comprises one or more objective lenses.

46. An electron-optical system, comprising:
an electron-optical column array including a plurality of electron-optical columns, wherein an electron-optical column of the plurality of electron-optical columns includes a plurality of electron-optical elements, wherein the plurality of electron-optical elements is arranged to form a conical electron beam channel, wherein the conical electron beam channel is configured to direct a primary electron beam to a sample secured on a stage, wherein the sample emits an electron beam in response to the primary electron beam; and
at least one electron detector, wherein the conical electron beam channel is configured to direct the electron beam to the at least one electron detector.

47. A characterization system, comprising:
a plurality of radiation sources, wherein at least some of the radiation sources are configured to generate a primary beam of radiation; and
a column array comprising a plurality of columns, wherein a column of the plurality of columns comprises a plurality of elements, wherein the plurality of elements includes:
a deflector layer configured to receive a voltage, wherein the deflector layer is configured to be driven via a common controller shared by at least some of the plurality of columns; and
a trim deflector layer configured to receive a trim voltage, wherein the trim deflector layer is configured to be driven by an individual controller,
wherein the plurality of elements is arranged to form a beam channel, wherein the beam channel is configured to direct the primary beam of radiation to a sample secured on a stage, wherein the sample generates a beam of radiation in response to the primary beam of radiation,
wherein the column further comprises at least one detector, wherein the beam channel is configured to direct the beam of radiation generated by the sample to the at least one detector.

* * * * *